United States Patent
Neumann et al.

(10) Patent No.: US 6,339,329 B1
(45) Date of Patent: Jan. 15, 2002

(54) METHOD FOR MANUFACTURING A GIANT RESISTIVE RATIO (GMR) BRIDGE DETECTOR AND A MAGNETORESISTIVE BRIDGE DETECTOR

(75) Inventors: Christian Neumann, Möglingen; Klaus Marx; Franz Jost, both of Stuttgart; Martin Freitag, Lohmar; Dietmar Senghaas, Heilbronn, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/171,074
(22) PCT Filed: Jan. 23, 1997
(86) PCT No.: PCT/DE97/00110
§ 371 Date: Apr. 29, 1999
§ 102(e) Date: Apr. 29, 1999
(87) PCT Pub. No.: WO97/39364
PCT Pub. Date: Oct. 23, 1997

(30) Foreign Application Priority Data

Apr. 12, 1996 (DE) .......................... 196 14 460

(51) Int. Cl.$^7$ ........................... G01R 33/09; H01L 43/12
(52) U.S. Cl. .................. 324/252; 338/32 R; 29/603.08; 148/108
(58) Field of Search ..................... 324/252; 338/32 R; 428/692; 148/108, 300, 310; 365/158; 360/313, 314; 29/603.07, 603.08

(56) References Cited

U.S. PATENT DOCUMENTS

| | | | |
|---|---|---|---|
| 4,769,093 A | * | 9/1988 | Kitada et al. ............... 365/158 |
| 6,123,781 A | * | 9/2000 | Shimazawa ................ 148/108 |

FOREIGN PATENT DOCUMENTS

| | | |
|---|---|---|
| DE | 35 42 280 | 9/1990 |
| DE | 42 94 151 | 1/1994 |
| DE | 44 25 356 | 3/1995 |
| EP | 0 642 182 A1 | 8/1994 |
| EP | 0 622 781 | 11/1994 |
| WO | 96/38739 | 12/1996 |

OTHER PUBLICATIONS

J.K. Spong et al., "Giant Magnetoresistive Spin Valve Bridge Sensor", IEEE Transactions on Magnetics, vol. 32, No. 2, Mar. 1996, pp. 366–371.

(List continued on next page.)

Primary Examiner—Walter Snow
(74) Attorney, Agent, or Firm—Kenyon & Kenyon

(57) ABSTRACT

A method for manufacturing a GMR bridge detector as well as the bridge detector itself in which magnetoresistive resistors are interconnected in the form of a bridge to detect a magnetic field. The resistors consist of a material that exhibits the giant magnetoresistive ratio (GMR) effect. The magnetoresistive sensitivity of the individual resistors is produced through annealing. The annealing of the resistors takes place through selective feeding of a current that is sufficient for reaching the temperature required for annealing into the bridge connections. Depending on the wiring of the bridge connections, the resistors are provided with the property necessary for the GMR effect either singly or in pairs. As the material for the resistors, in particular, a material of the class of discontinuous multilayer materials, particularly NiFe/Ag, is used in which the GMR property is produced through single annealing at a specific temperature.

10 Claims, 1 Drawing Sheet

OTHER PUBLICATIONS

T.L. Hylton et al., "Giant Magnetoresistance at Low Fields in Discontinuous NiFe–Ag Multilayer Thin Films", Science, vol. 261, Aug. 20, 1993, pp. 1021–1024.

J.M. Daughton, "GMR Sensors", Proceedings of the Fourth International Symposium On Magnetic Materials, Processes, and Devices, Application to Storage and Micromechanical Systems, Electrochemical Society Proceedings, vol. 95, No. 18, (1996) pp. 109–110.

Solid State Physics, Advances in Research and Applications, Editors Henry Ehrenreich and David Turnbull,(Founding Editors Frederick Seitz and David Turnbull), Division of Applied Sciences Harvard University Cambridge, Massachusetts, vol. 47, pp. 367–377.

Sensors, A. comprehensive Survey, Edited by W. Göpel, J. Hesse, J. N. Zemel, vol. 5, Magentic Sensors Edited by R. Boll, K. J. Overshott, pp. 360, 361 and 379.

* cited by examiner

METHOD FOR MANUFACTURING A GIANT RESISTIVE RATIO (GMR) BRIDGE DETECTOR AND A MAGNETORESISTIVE BRIDGE DETECTOR

FIELD OF THE INVENTION

The present invention relates to a GMR bridge detector in which magnetoresistive resistors are interconnected in the form of a bridge to detect a magnetic field.

BACKGROUND INFORMATION

In a GMR bridge detector provided by the company Nonvolatile Inc., Eden Prairie, MN 55344, U.S. that is described as the NVS5B50 GMR Bridge Detector in a company brochure dated August 1995, four resistors made of GMR material are interconnected in a Wheatstone bridge to detect magnetic fields. In this known bridge detector, two of the four resistors are magnetically shielded by thick magnetic material to thus have fixed resistance reference values, and two further resistors change their resistance according to the applied magnetic field or rather the magnetic field to be measured. The change in the resistance value of these two resistors can lead to a voltage change of approx. 5–6% of the applied voltage. The two resistors exposed to the magnetic field that change their resistance are arranged between specially formed magnetic flux concentrators. In this manner, the detector is saturated for fields that are smaller than the saturation fields of the actual GMR material used. This known arrangement shows how difficult it is and what significant expense is required to manipulate the resistors of a bridge circuit so that they have different sensitivity to the external magnetic field and react accordingly.

GMR stands for Giant Magnetoresistive Ratio, i.e., the magnetoresistive properties of this material, i.e., its magnetoresistive effect, are considerable and significantly greater than in an ordinary magnetoresistive material. In an article entitled "Giant Magnetoresistance at Low Fields in Discontinuous NiFe—Ag Multilayer Thin Films" by T. L. Hylton, K. R. Coffey, M. A. Parker, J. K. Howard that appeared in SCIENCE, Vol. 261, Aug. 20, 1993, pp. 1021–1024, various multilayer thin-film arrangements are described that include the material combination NiFe/Ag in respectively different layer thicknesses. In these materials, a significantly increased magnetoresistive sensitivity is observed through heating or tempering at (annealing) a specific temperature of about 330° C. In the annealing process, discontinuous layer structures arise by way of which the GMR effect is supposed to be caused. The annealing is carried out through normal heating of the material and subsequent cooling down. Nothing is mentioned in this literature source regarding a specific arrangement of these materials in a certain application manner.

SUMMARY OF THE INVENTION

A method according to the present invention for manufacturing a GMR bridge detector has the advantage of significantly simplified and very easily controllable and meterable annealing of the resistors. The result is a significantly more cost-effective manufacturing process for GMR bridge detectors and associated with this, a more cost-effective component.

According to the present invention, this is achieved in that the magnetoresistive sensitivity of the individual resistors is produced through annealing, that the annealing of the resistors is performed through selective feeding of a current sufficient for attaining the temperature needed for annealing into the bridge connections and thus the resistors are provided with the property needed for the GMR effect.

According to a first embodiment of the method according to the present invention, each resistor is heated individually to the temperature sufficient for annealing by applying a voltage sufficient for annealing to its directly neighboring bridge connections and then cooled down thereafter.

According to a second embodiment of the method according to the present invention, it is provided that in each case two resistors lying in different bridge arms are annealed by feeding in current via in each case two directly neighboring bridge connections placed at the same potential.

In a third embodiment of the method according to the present invention, the individual resistors have in each case the same resistance value prior to annealing. Advantageously, the feeding in of the suitable current takes place once in the method according to the invention.

The method according to the present invention is suited in a particularly useful refinement to manufacture of GMR bridge detectors if as the material for the resistors a material from the class of discontinuous multilayer materials, particularly NiFe/Ag, is used in which the GMR property can be produced through annealing at a certain temperature.

In another embodiment of the present invention, a magnetoresistive bridge detector is created in which resistors are interconnected in the form of a bridge to detect a magnetic field. The resistors consist of a material that exhibits the GMR effect. The magnetoresistive sensitivity of the individual resistors is manufactured through annealing, and the annealing has taken place once through heating to the temperature necessary for annealing using controlled feeding of current into the bridge connections. In this magnetoresistive GMR bridge detector, as a material for the resistors, a material is used that exhibits after a single annealing process a different GMR effect than before, particularly a material in a multilayer arrangement of the material combination NiFe/Ag.

DETAILED DESCRIPTION

Figure 1:
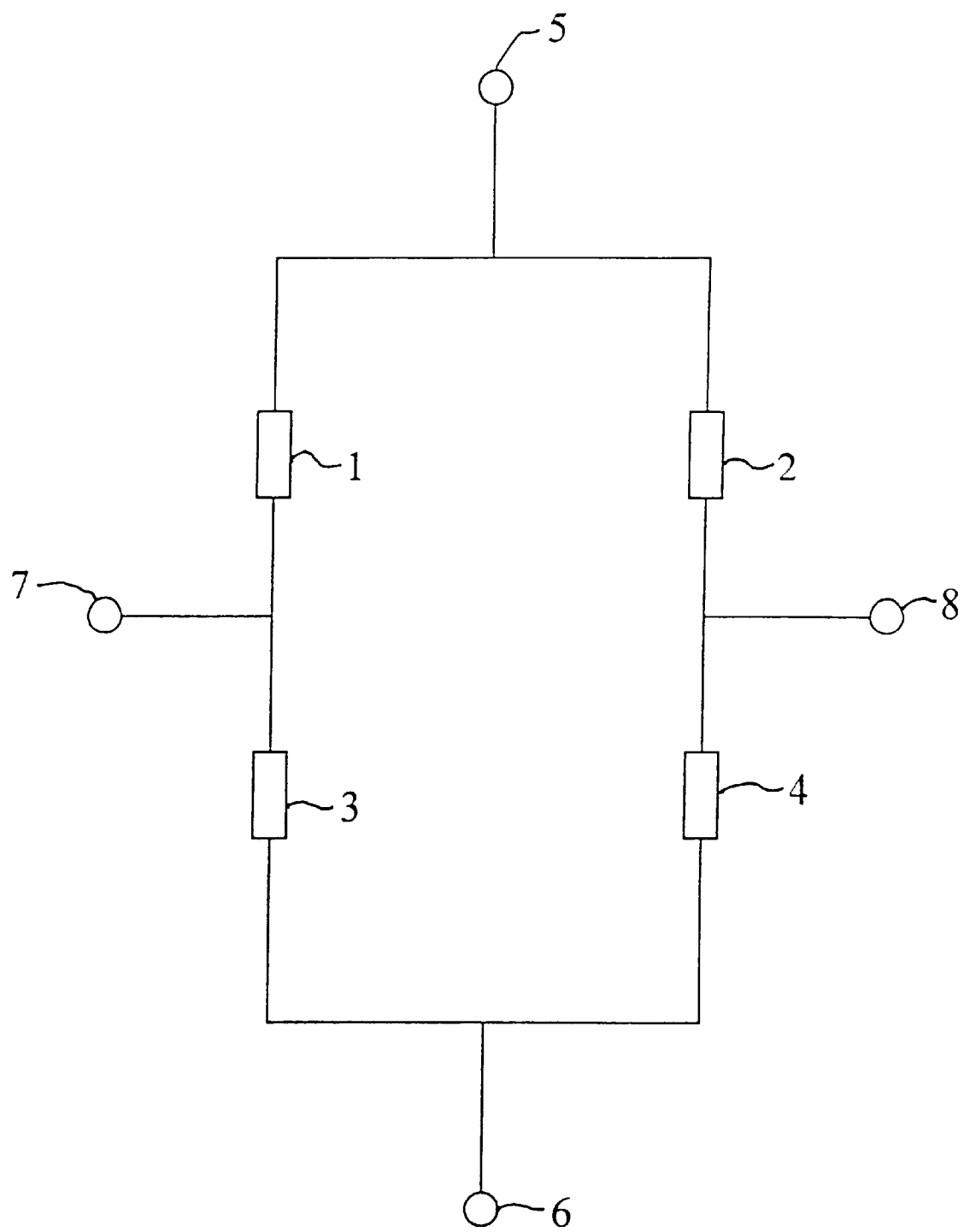
FIG. 1 shows a schematic diagram of a bridge circuit with four resistors and associated four bridge connections.

FIG. 1 shows a bridge circuit having four resistors 1, 2, 3, 4 with four associated bridge connections 5, 6, 7 and 8. The four resistors 1–4 are manufactured from a material that exhibits the so-called GMR effect following an annealing process. As a result, the bridge circuit forms an ideal magnetoresistive detector that has a high sensitivity for measurement of magnetic fields. As the GMR material, one is preferred from the class of so-called discontinuous multilayer arrangements, particularly manufactured in thin-layer technology from the material combination NiFe and Ag. For the annealing process of these materials, temperatures of approx. 300° C. or somewhat greater are required so that the arrangement changes itself such that it exhibits the GMR effect permanently. The annealing process is performed only once.

According to the method according to the present invention, the annealing process is not performed until after the complete manufacture of the detector in thin-layer technology is finished in its bridge configuration. In other words, the actual component is ready prior to the annealing. The annealing procedure takes place according to the present invention by feeding current into corresponding bridge connections. Here, according to the present invention, the bridge resistors can be annealed either singly or in pairs in different bridge arms. The strength of the current is selected such that a sufficient current density is attained to reach the temperature needed for annealing at the location of the respective resistor.

A first embodiment of the method according to the present invention provides individual annealing of each resistor. To do this, a voltage sufficient for annealing is applied to the directly neighboring connections of each resistor. For single annealing of, e.g., resistor 2, the current is fed into connections 5 and 8. With a sufficiently great current density, in this case resistor 2 heats up since a significantly greater current flows through it than through the resistors 1, 3 and 4 connected in series in this configuration. In this manner, this resistor 2 is to be selectively and purposefully altered in its GMR behavior with respect to the other resistors 1, 3 and 4. In an advantageous manner, the output (starting) values of the four resistors 1–4 are the same size. This also simplifies the manufacture in thin-film technology. From the following Table 1, it can be seen how the annealing of the individual resistors 1–4 takes place according to the configuration and wiring (connections) shown in FIG. 1.

TABLE 1

| Current fed into connection: | Annealing of resistor: |
|---|---|
| 5 and 8 | 2 |
| 8 and 6 | 4 |
| 6 and 7 | 3 |
| 7 and 5 | 1 |

With this method, it is possible to anneal each individual resistor in the bridge circuit.

The case in which respectively exactly one resistor of the resistors connected in series of each bridge arm reacts differently to the external magnetic field is relevant in practice and of particular importance. Corresponding to a second embodiment of the method according to the present invention, the current is fed in via (in each case) two directly neighboring bridge connections placed at the same potential. In one case, the current is fed in simultaneously on connections 5 and 7 and also on connections 8 and 6, connections 5 and 8 as well as 7 and 6 in each case being placed at the same potential. In this case, the current flows exclusively via the resistors 1 and 4 that lie in different bridge arms. These two resistors 1 and 4 heat up accordingly, while the resistors 2 and 3 are current-free. From the following Table 2, it can be seen how the annealing of individual resistors in different bridge arms takes place according to the configuration and wiring (connections) shown in FIG. 1.

TABLE 2

| Current fed into connection: | Same electric potential at connection: | Annealing of resistor: |
|---|---|---|
| 5 & 7; 8 & 6 | 5 & 7; 8 & 6 | 2 & 3 |
| 5 & 8; 7 & 6 | 5 & 8; 7 & 6 | 1 & 4 |

The present invention makes it possible provide a GMR bridge detector in a simple and cost-effective manner. The manufacturing method according to the present invention makes superfluous a significant manufacturing segment with deposition, lithography and etching steps, resulting in significant cost savings. Moveover, the annealing process for individual resistors or in each case one resistor in a bridge arm is relatively easy to control and simple to perform using controlled feeding in of current. Furthermore, another advantage of the present invention lies also in the fact that the multilayer coating system is disposed of(deposited), the detector layout, i.e., the bridge circuit with its connections, is etched and not until then with the layout already available two of the four bridge resistors are annealed either jointly or individually and thus made sensitive to an external magnetic field.

What is claimed is:

1. A magnetoresistive bridge detector, comprising:
   a plurality of resistors which are interconnected to form a bridge for detecting a magnetic field, the resistors being composed of a material exhibiting a giant magnetoresistive ratio (GMR) effect, the bridge including bridge connections,
   wherein at least one of the resistors has a magnetoresistive sensitivity which is produced using an annealing procedure, and
   wherein the annealing procedure is performed a single time by providing a particular current, in a controlled manner, to the bridge connections for heating the at least one of the resistors, to attain a particular temperature at the at least one of the resistors for annealing the resistors.

2. The magnetoresistive bridge detector according to claim 1, wherein, after the annealing procedure, the material exhibits a further GMR effect which is different from the GMR effect.

3. The magnetoresistive bridge detector according to claim 2, wherein the material includes a multilayer arrangement composed of NiFe/Ag.

4. A method for manufacturing a giant magnetoresistive ratio (GMR) bridge detector, the GMR bridge detector including magnetoresistive resistors, the magnetoresistive resistors being composed of a material exhibiting a GMR effect, the method comprising the steps of:
   interconnecting the magnetoresistive resistors to form a bridge for detecting a magnetic field, the bridge including bridge connections; and
   selectively providing a particular current to at least one connection of the bridge connections for heating at least one of the magnetoresistive resistors, the particular current being sufficient to attain a particular temperature at the at least one of the magnetoresistive resistors for annealing the at least one of the magnetoresistive resistors, wherein the at least one of the magnetoresistive resistors is annealed to produce a magnetoresistive sensitivity of the at least one of the magnetoresistive resistors and to enable the at least one of the magnetoresistive resistors to exhibit the GMR effect.

5. The method according to claim 4, further comprising the steps of:

applying a particular voltage directly to further connections of the bridge connections for heating each of the magnetoresistive resistors to the particular temperature, the particular voltage being sufficient to anneal the at least one of the magnetoresistive resistors; and cooling each of the magnetoresistive resistors after the particular voltage is applied to the further connections.

6. The method according to claim 4, further comprising the step of:

placing two directly neighboring connections of the bridge connection at a same potential, wherein the particular current is provided to the two directly neighboring connections so that two resistors of the magnetoresistive resistors are annealed, the two resistors lying in different bridge arms of the bridge.

7. The method according to claim 4, wherein, before the step of providing the particular current, each of the magnetoresistive resistors has a same resistance value.

8. The method according to claim 4, wherein the particular current is provided at the at least one connection of the bridge connections only once.

9. The method according to claim 4, wherein the material includes a particular material from a class of discontinuous multilayer materials.

10. The method according to claim 9, wherein the particular material includes NiFe/Ag.

* * * * *